US012660358B2

(12) United States Patent
Sze

(10) Patent No.: US 12,660,358 B2
(45) Date of Patent: Jun. 16, 2026

(54) IMAGE SENSOR INCLUDING SILICON VERTICALLY STACKED WITH GERMANIUM LAYER

(71) Applicant: Taiwan Semiconductor Manufacturing Company, Ltd., Hsin-Chu (TW)

(72) Inventor: Jhy-Jyi Sze, Hsin-Chu City (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 215 days.

(21) Appl. No.: 18/346,969

(22) Filed: Jul. 5, 2023

(65) Prior Publication Data

US 2023/0352514 A1 Nov. 2, 2023

Related U.S. Application Data

(60) Continuation of application No. 17/215,040, filed on Mar. 29, 2021, now Pat. No. 11,742,375, which is a
(Continued)

(51) Int. Cl.
*H10F 39/00* (2025.01)
*H10F 30/225* (2025.01)
(Continued)

(52) U.S. Cl.
CPC ......... *H10F 39/811* (2025.01); *H10F 30/225* (2025.01); *H10F 39/014* (2025.01);
(Continued)

(58) Field of Classification Search
CPC .. H10F 39/184; H10F 39/8027; H10F 39/811; H10F 30/225; H10F 39/014;
(Continued)

(56) References Cited

U.S. PATENT DOCUMENTS

| | | |
|---|---|---|
| 8,450,728 B2 | 5/2013 | Yamaguchi |
| 2006/0044429 A1 | 3/2006 | Toda et al. |

(Continued)

OTHER PUBLICATIONS

Non-Final Office Action dated Jun. 10, 2020 for U.S. Appl. No. 16/273,292.
(Continued)

*Primary Examiner* — Aaron J Gray
(74) *Attorney, Agent, or Firm* — Eschweiler & Potashnik, LLC

(57) ABSTRACT

Various embodiments of the present disclosure are directed towards an integrated chip having a first image sensor element including a first doped region disposed within a substrate. The substrate comprises a first material and has a first surface opposite a second surface. A second image sensor element overlies the first image sensor element. The second image sensor element includes an active layer disposed in the substrate directly over the first doped region. The first doped region and the active layer are spaced vertically between the first and second surfaces of the substrate. The active layer comprises a second material different from the first material.

20 Claims, 11 Drawing Sheets

Related U.S. Application Data division of application No. 16/273,292, filed on Feb. 12, 2019, now Pat. No. 10,985,201.

(60) Provisional application No. 62/738,477, filed on Sep. 28, 2018.

(51) Int. Cl.

| | |
|---|---|
| *H10F 39/12* | (2025.01) |
| *H10F 39/18* | (2025.01) |
| *H10F 71/00* | (2025.01) |
| *H10F 77/122* | (2025.01) |
| *H10W 20/41* | (2026.01) |
| *H10W 90/00* | (2026.01) |

(52) U.S. Cl.
CPC ........... *H10F 39/18* (2025.01); *H10F 39/184* (2025.01); *H10F 39/1843* (2025.01); *H10F 39/199* (2025.01); *H10F 39/802* (2025.01); *H10F 39/8027* (2025.01); *H10F 39/8033* (2025.01); *H10F 39/8037* (2025.01); *H10F 39/807* (2025.01); *H10F 39/809* (2025.01); *H10F 71/121* (2025.01); *H10F 77/122* (2025.01); *H10W 20/435* (2026.01); *H10W 90/00* (2026.01)

(58) Field of Classification Search
CPC .... H10F 39/18; H10F 39/1843; H10F 39/199; H10F 39/802; H10F 39/8037; H10F 39/809; H10F 71/121; H10F 77/122
See application file for complete search history.

(56) References Cited

U.S. PATENT DOCUMENTS

| | | | | |
|---|---|---|---|---|
| 2008/0121805 | A1 | 5/2008 | Tweet et al. | |
| 2011/0012221 | A1* | 1/2011 | Fujikata | H10F 77/148 |
| | | | | 257/458 |
| 2012/0313204 | A1 | 12/2012 | Haddad et al. | |
| 2015/0243694 | A1* | 8/2015 | Ihara | H10F 39/812 |
| | | | | 257/443 |
| 2015/0255498 | A1 | 9/2015 | Sugiura | |
| 2016/0116409 | A1 | 4/2016 | Massetti et al. | |
| 2017/0040362 | A1 | 2/2017 | Na et al. | |
| 2017/0062508 | A1 | 3/2017 | Na et al. | |
| 2017/0117316 | A1 | 4/2017 | Hsu et al. | |
| 2017/0134704 | A1 | 5/2017 | Otsubo et al. | |
| 2017/0162624 | A1* | 6/2017 | Hatano | H04N 25/76 |
| 2017/0170238 | A1 | 6/2017 | Lee et al. | |
| 2017/0172393 | A1* | 6/2017 | Fukunaga | A61B 1/042 |
| 2017/0186778 | A1 | 6/2017 | Miyake et al. | |
| 2017/0186799 | A1 | 6/2017 | Lin et al. | |
| 2018/0233521 | A1* | 8/2018 | Na | H10F 39/809 |
| 2020/0076999 | A1* | 3/2020 | Akiyama | H10F 39/812 |

OTHER PUBLICATIONS

Notice of Allowance dated Dec. 23, 2020 for U.S. Appl. No. 16/273,292.

Non-Final Office Action dated Nov. 10, 2022 for U.S. Appl. No. 17/215,040.

Notice of Allowance dated Apr. 12, 2023 for U.S. Appl. No. 17/215,040.

* cited by examiner

300a
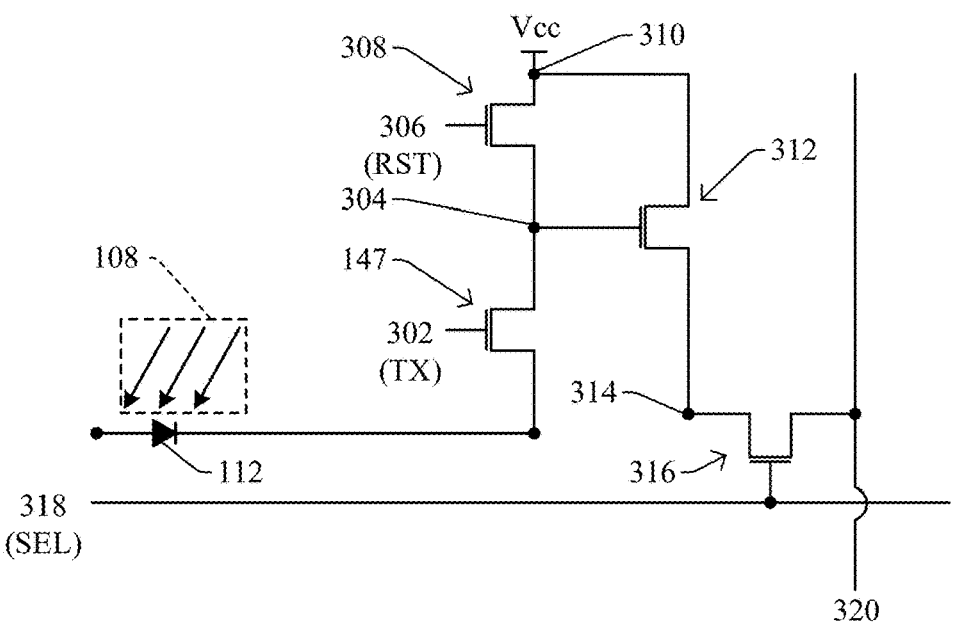
Vcc
308
310
306
(RST)
304
147
302
(TX)
108
112
314
316
318
(SEL)
320
312
Fig. 3A
300b
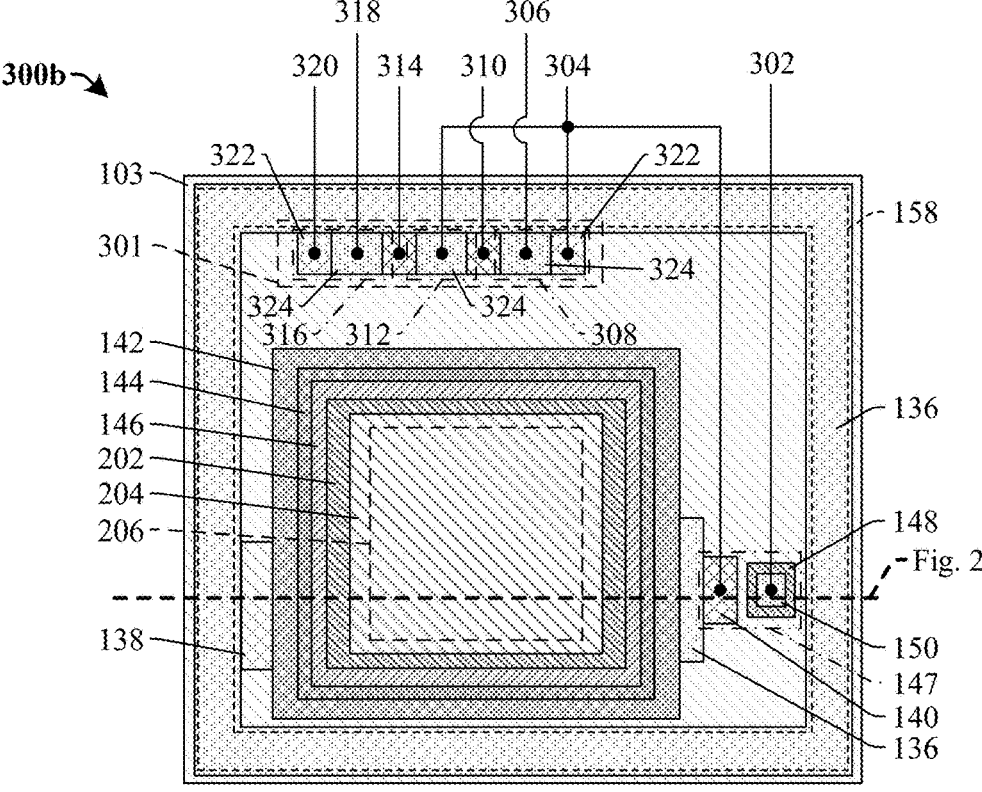
318
320    314    310    304          302
322                                    322
103
301
324    324    324    324
316    312              308
142
144
146
202
204
206
138
158
136
148
Fig. 2
150
147
140
136
324
Fig. 3B

700

704          702          704          704

103

800

134
136
152
154
103

136          136

900

1000

1100

1200

1300

1400

1500

1600

1700 ⬉

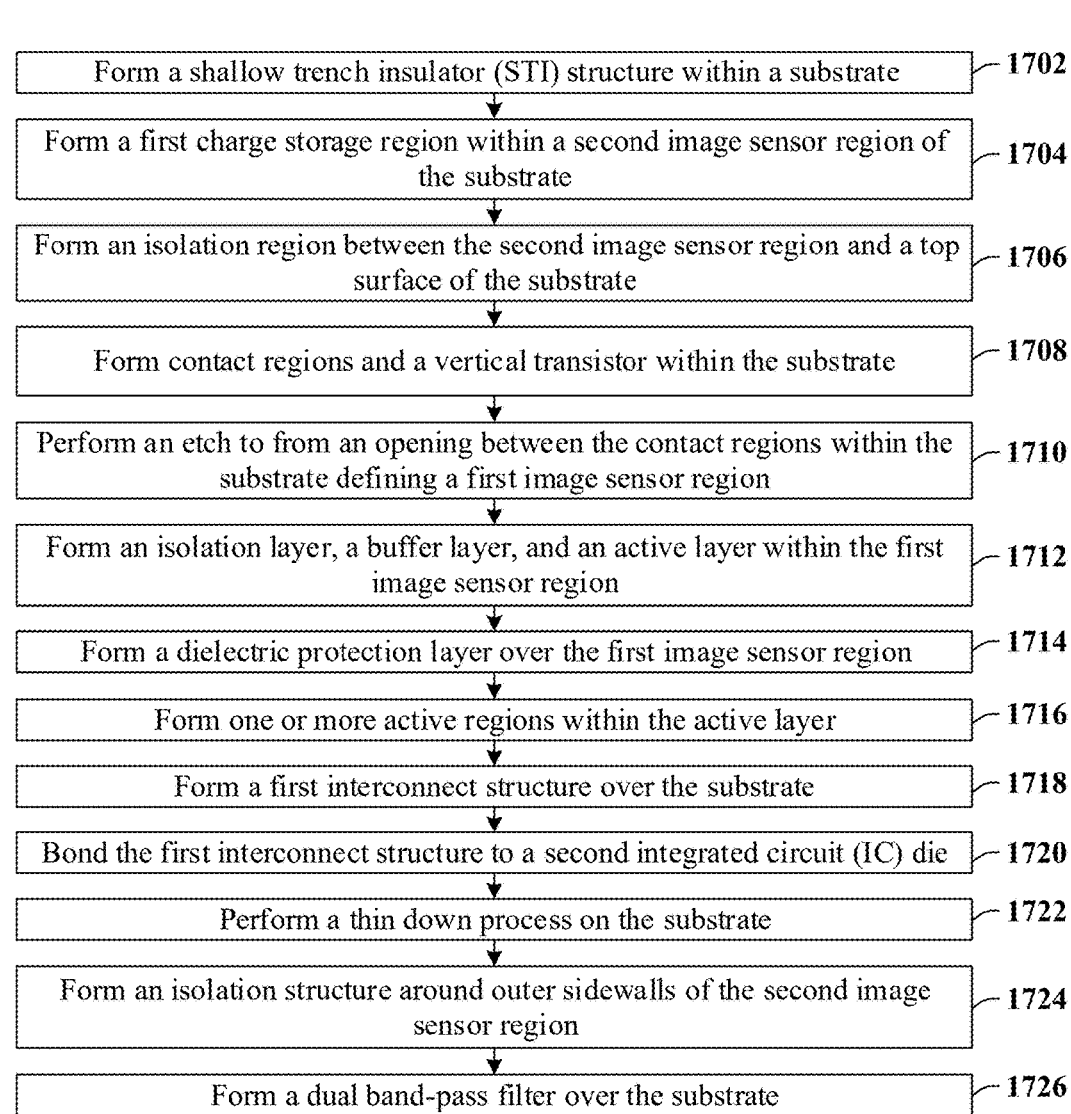

| Form a shallow trench insulator (STI) structure within a substrate | 1702 |

| Form a first charge storage region within a second image sensor region of the substrate | 1704 |

| Form an isolation region between the second image sensor region and a top surface of the substrate | 1706 |

| Form contact regions and a vertical transistor within the substrate | 1708 |

| Perform an etch to from an opening between the contact regions within the substrate defining a first image sensor region | 1710 |

| Form an isolation layer, a buffer layer, and an active layer within the first image sensor region | 1712 |

| Form a dielectric protection layer over the first image sensor region | 1714 |

| Form one or more active regions within the active layer | 1716 |

| Form a first interconnect structure over the substrate | 1718 |

| Bond the first interconnect structure to a second integrated circuit (IC) die | 1720 |

| Perform a thin down process on the substrate | 1722 |

| Form an isolation structure around outer sidewalls of the second image sensor region | 1724 |

| Form a dual band-pass filter over the substrate | 1726 |

Fig. 17

IMAGE SENSOR INCLUDING SILICON VERTICALLY STACKED WITH GERMANIUM LAYER

REFERENCE TO RELATED APPLICATIONS

This Application is a Continuation of U.S. application Ser. No. 17/215,040, filed on Mar. 29, 2021, which is a Divisional of U.S. application Ser. No. 16/273,292, filed on Feb. 12, 2019 (now U.S. Pat. No. 10,985,201, issued on Apr. 20, 2021), which claims the benefit of U.S. Provisional Application No. 62/738,477, filed on Sep. 28, 2018. The contents of the above-referenced Patent Applications are hereby incorporated by reference in their entirety.

BACKGROUND

Integrated circuits (IC) with image sensors are used in a wide range of modern day electronic devices. In recent years, complementary metal-oxide semiconductor (CMOS) image sensors (CISs) have begun to see widespread use, largely replacing charge-coupled devices (CCD) image sensors. Compared to CCD image sensors, CISs are increasingly favored due to low power consumption, a small size, fast data processing, a direct output of data, and low manufacturing cost.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 3A illustrates a circuit diagram of some embodiments of the stacked image sensor device of FIG. 2.

FIG. 3B illustrates a top view of some embodiments of the stacked image sensor device of FIG. 2, as indicated by the cut-line in FIG. 2.

FIG. 17 illustrates a methodology in flowchart format that illustrates some embodiments of a method of forming a stacked image sensor.

DETAILED DESCRIPTION

Figure 1:
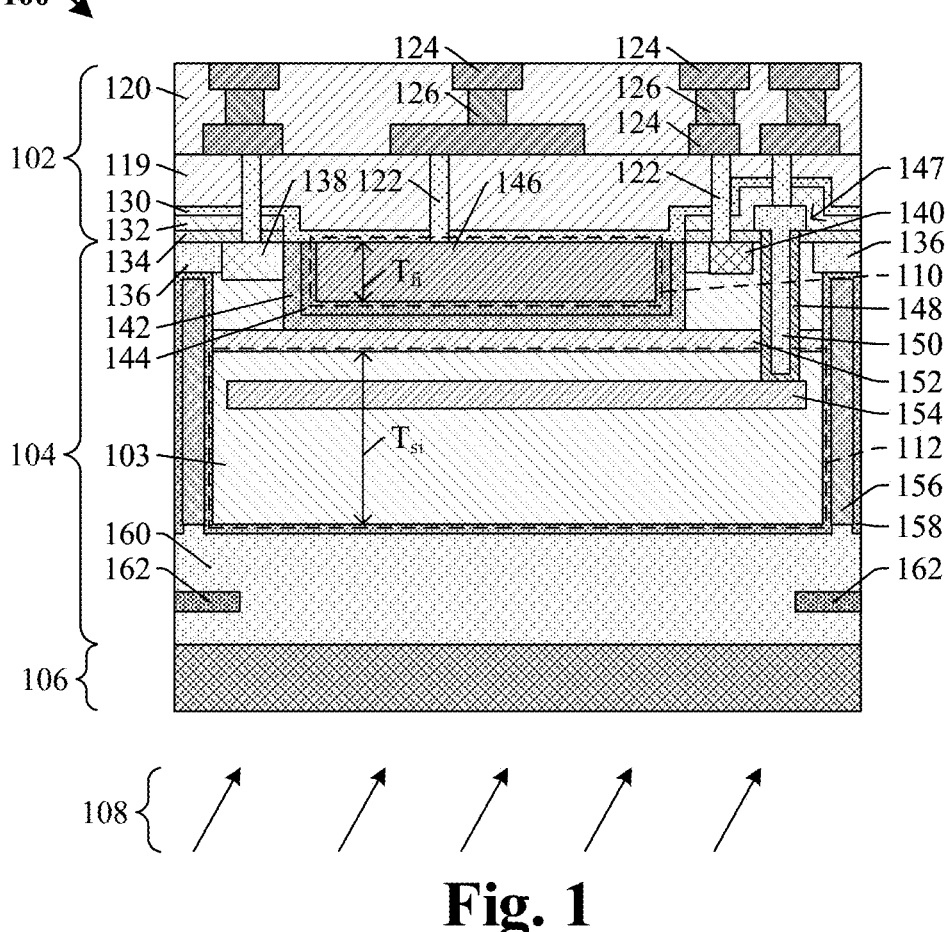
FIG. 1 illustrates a cross-sectional view of some embodiments of a stacked image sensor device comprising a first image sensor element overlying a second image sensor element.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In recent years, three-dimensional integrated chips (3DICs) have begun to see widespread use in the semiconductor industry. 3DICs are manufactured by stacking multiple integrated chip (IC) die on top of one another. The stacked IC die may be electrically interconnected using through-substrate-vias (TSVs) that vertically extend through an IC die and electrically couple interconnect structures of each IC die in the 3DIC. By vertically interconnecting the IC die, the stacked IC die behave as a single IC device.

CMOS (complementary metal-oxide-semiconductor) image sensors (CISs) may be formed on an image sensor die, which can be integrated into 3DICs. Typically, image sensor die are stacked onto IC die having logic and/or memory. However, multiple image sensor die can also be stacked in a 3DIC, resulting in vertically stacked arrays of image sensor elements such that TSVs and interconnect structures (comprising conductive wires and conductive vias) exist between the CISs.

For example, a first IC die in a 3DIC may comprise a first image sensor element (e.g., photodiode) and a second IC die overlying the first IC die may comprise a second image sensor element (e.g., photodiode). The first image sensor element may, for example, be configured to generate electrical signals from an electromagnetic radiation within a first range of wavelengths (e.g., the first range of wavelengths comprises infrared (IR) radiation) and the second image sensor element may, for example, be configured to generate electrical signals from the electromagnetic radiation with a second range of wavelengths (e.g., the second range of wavelengths comprises visible light). However, TSVs and at least one interconnect structure (conductive wires and/or vias comprising tantalum nitride) exist between and/or above the first image sensor element and the second image sensor element. The 3DIC may suffer loss of the first range of wavelengths through the second image sensor element, TSVs, and/or the at least one interconnect structure. The loss may be amplified due to the conductive materials (e.g., IR radiation is highly reactive to tantalum nitride, resulting in less IR radiation delivered to the first image sensor) used in the TSVs and/or the at least one interconnect structure.

In yet another example, the second image sensor element may directly overlie the first image sensor element on a single IC die. The first and second image sensor elements are within a semiconductor substrate with a single material (e.g., silicon) separated by an isolation layer comprising the single material. An interconnect structure and bond pads electrically couple the first and second image sensor elements to an underlying second IC die comprising logic and/or memory. Therefore, losses due to the interconnect structure and/or TSVs blocking and/or reacting with the electromagnetic radiation are mitigated. However, the first image sensor element may have reduced quantum efficiency (QE) for near IR (NIR) applications (e.g., wavelength of 0.7-5 micrometers) because of a reduced ability to capture IR radiation (e.g., limited to detecting wavelengths less than approximately 1.2 micrometers). The reduced QE in NIR applications may, for example, be due to a high transparency of the single material (e.g., silicon) and/or thickness of the first image sensor element with respect to NIR radiation. Further, the reduced ability to capture IR radiation mitigates design choices for placement of image sensor devices (e.g., vertical transistors) and integration in direct time of flight (D-TOF) applications. A thickness of the first image sensor element may be increased to increase IR sensitivity. However, as the thickness (e.g., within a range of approximately 2 micrometers to approximately 4 micrometers) of the first image sensor element increases placement of image sensor devices for the second image sensor element becomes increasingly challenging.

The present disclosure, in some embodiments, relates to a stacked image sensor device including a first image sensor element comprising a first material (e.g., germanium) overlying a second image sensor element comprising a second material (e.g., silicon) within a single IC die. The first image sensor element is configured to generate electrical signals from electromagnetic radiation within a first range of wavelengths (e.g., IR radiation). The second image sensor element is configured to generate electrical signals from electromagnetic radiation within a second range of wavelengths (e.g., visible light). The first image sensor element is thin (e.g., less than 1.5 micrometers) with respect to the thickness of the second image sensor element. This, in turn, increases design flexibility and/or placement flexibility of image sensor devices (e.g., vertical transistors) adjacent to the first image sensor element. The first material is selected to have high sensitivity to electromagnetic radiation within the first range of wavelengths. The second image sensor element is thick (e.g., greater than 3 micrometers) in relation to the first image sensor element, such that high sensitivity to the electromagnetic radiation within the second range of wavelengths is achieved. By selecting a favorable thickness and material of the first and second image sensor elements, the stacked image sensor device can achieve high IR and visible light sensitivity with mitigated cross-talk between the first and second image sensor elements and mitigated redesign of current applications.

FIG. 1 illustrates a cross-sectional view of some embodiments of a stacked image sensor device 100.

The stacked image sensor device 100 comprises an interconnect structure 102 overlying a first integrated circuit (IC)

die 104 and a dual band-pass filter 106. The first IC die 104 includes a first image sensor element 110 overlying a second image sensor element 112. The first and second image sensor elements 110, 112 are configured to convert electromagnetic radiation 108 (e.g., photons) into electrical signals (e.g., to generate electron-hole pairs from the electromagnetic radiation 108). The electromagnetic radiation 108 is back side illuminated (BSI) upon the stacked image sensor device 100. The first image sensor element 110 is configured to generate electrical signals from electromagnetic radiation 108 within a first range of wavelengths, while the second image sensor element 112 is configured to generate electrical signals from electromagnetic radiation 108 within a second range of wavelengths that is different than the first range of wavelengths. In some embodiments, the first image sensor element 110 may, for example, be configured to generate electrical signals from infrared (IR) radiation (e.g., electromagnetic radiation with wavelengths in a range of between approximately 700 nanometers (nm) to approximately 1 millimeter (mm)), while the second image sensor element 112 may, for example, be configured to generate electrical signals from visible light (e.g., electromagnetic radiation with wavelengths in a range of between approximately 400 nm and approximately 700 nm).

The first and second image sensor elements 110, 112 are formed within a substrate 103 of the first IC die 104. The substrate 103 is comprised of a second material (e.g., silicon) such that the second image sensor element 112 comprises intrinsic and/or doped regions of the second material. The second image sensor element 112 comprises a bottom charge storage region 154. The bottom charge storage region 154 is configured to collect and store charge (e.g., photons) collected/captured from the electromagnetic radiation 108 in the second range of wavelengths. The first image sensor element 110 comprises an active layer 146 surrounded by a top isolation structure 142 and a buffer layer 144. The top isolation structure 142 is comprised of the second material and provides electrical isolation to the first image sensor element 110 from adjacent devices (such as the second image sensor element 112) within the first IC die 104. The buffer layer 144 is comprised of a combination of the second material and a first material (e.g., germanium) and provides a transition region between the top isolation structure 142 and the active layer 146. The active layer 146 is comprised of the first material and may, for example, contain photodetector regions and/or layers such as charge storage region(s), floating node(s), surface pinning region(s), contact region(s), guard ring(s), etc. In some embodiments, the first material, may for example, be or comprise germanium and the first image sensor element 110 may be formed to a thickness $T_{fi}$ within a range of approximately 0.3 micrometers to approximately 1.5 micrometers. In some embodiments, the second material may, for example, be or comprise silicon and the second image sensor element 112 may be formed to a thickness $T_{si}$ within a range of approximately 3 micrometers to approximately 6 micrometers.

The thicknesses $T_{fi}$, $T_{si}$ are each selected to ensure high quantum efficiency (QE) for the first and second range of wavelengths. For example, if the thickness $T_{fi}$ is thin (e.g., less than approximately 0.3 micrometers) the first image sensor element 110 will have poor IR light QE, and thus will have a decreased ability for phase detection. Further, if the thickness $T_{fi}$ is thick (e.g., greater than approximately 1.5 micrometers) placement of pixel devices such as contact regions, isolation structures, and/or vertical transistors will be affected. This, in turn, mitigates an ability of both the first and second image sensor elements 110, 112 to detect and/or process the electromagnetic radiation 108. Additionally, if the thickness $T_{si}$ is thin (e.g., less than approximately 3 micrometers) the second image sensor element 112 will have poor visible light QE, thereby decreasing accurate image formation. Further, if the thickness $T_{si}$ is thick (e.g., greater than approximately 6 micrometers) the second image sensor element 112 will have increased pollution/interference from the first range of wavelengths. This, in turn, results in cross-talk between the first and the second image sensor elements 110, 112, thereby decreasing the second image sensor element's 112 ability to capture the second range of wavelengths and pass the first range of wavelengths.

The first and second materials are each selected to ensure high QE for the first and second range of wavelengths. For example, when the first material is germanium or a similar material, the first image sensor element 110 may be formed to a thin thickness with high IR sensitivity. Further, when the second material is silicon or a similar material, the second image sensor element 112 may be formed to a suitable thickness (e.g., within a range of approximately 3 micrometers to approximately 6 micrometers). The suitable thickness aides in the first range of wavelengths passing through the second image sensor element 112, thereby mitigating interfere with the absorption of the second range of wavelengths. Therefore, the first and second image sensor elements 110, 112 with the aforementioned thicknesses and materials allow for high IR and visible light sensing capability on a single IC die with low optical cross-talk between the IR and visible light signals.

In some embodiments, the thickness $T_{fi}$ of the first image sensor element 110 is approximately one half, one third, and/or one fourth the thickness $T_{si}$ of the second image sensor element 112. In some embodiments, the thickness $T_{si}$ is within a range of approximately 2-20 times greater than the thickness $T_{fi}$. In some embodiments, the first material has a first index of refraction (e.g., approximately 4) that is greater than a second index of refraction of the second material (e.g., approximately 3.4). In some embodiments, the first material has a first density (e.g., approximately 5.33 $g/cm^3$) that is greater than a second density of the second material (e.g., approximately 2.33 $g/cm^3$). In some embodiments, the first material is different than the second material. In some embodiments, the first material has a first operating voltage (e.g., less than 10 volts) less than a second operating voltage of the second material (e.g., greater than 14 volts).

A dual band-pass filter 106 is disposed below the first and second image sensor elements 110, 112. The dual band-pass filter 106 is placed between the electromagnetic radiation 108 and the second image sensor element 112 to allow visible light (e.g., for image formation) as well as infrared (IR) light (e.g., for depth detection and/or phase detection) to pass through the dual band-pass filter 106 to the first and second image sensor elements 110, 112. The dual band-pass filter 106 is configured to pass the electromagnetic radiation 108 within a passband (or two different passbands) including the first and second range of wavelengths, while reflecting the electromagnetic radiation 108 outside of the passband and including a third range of wavelengths.

Backside shielding structures 162 include two segments within an inter-metal dielectric (IMD) layer 160 directly under a backside deep trench isolation (BDTI) structure. The BDTI structure comprises a trench dielectric layer 156 and a passivation layer 158. The backside shielding structures 162 allow the electromagnetic radiation 108 to pass between the two segments to the first and second image sensor elements 110, 112. In some embodiments, the stacked image sensor device 100 is disposed within an array of rows and columns of the first image sensor element 110 overlying the second image sensor element 112. The backside shielding structures 162 are between each pair of the first and second image sensor elements 110, 112 in the array. The BDTI structure provides electrical and electromagnetic isolation between the first and second image sensor elements 110, 112 and other image sensors and/or image sensor devices disposed within the first IC die 104.

A middle isolation region 152 is within the substrate 103 and provides electrical isolation between the first and second image sensor elements 110, 112. A vertical transistor (VTX) 147 extends through the substrate 103 and directly contacts the bottom charge storage region 154. The VTX 147 comprises a gate electrode 150 and a gate dielectric layer 148. The VTX 147 is configured to transfer charge accumulated in the second image sensor element 112 to overlying metal layers. A shallow trench isolation (STI) structure 136 is within the substrate 103 and comprises multiple segments. An outer two segments of the STI structure 136 are in direct contact with the passivation layer 158. The STI structure 136 provides electrical isolation between the first image sensor element 110 and pixel devices and/or contact regions within the substrate 103. A plurality of contact regions such as a first contact region 138 and a first floating node 140 are within the substrate 103. In some embodiments, the contact region 138 acts as a contact to apply a bias to the substrate 103. In some embodiments, the first floating node 140 acts as a floating node and/or a charge storage region (e.g., for a conversion of photons to an electrical signal and/or for a storage region of the charge derived from the photons).

The interconnect structure 102 includes a plurality of dielectric layers 130, 132, 134 over the substrate 103. In some embodiments, the dielectric layer 130 acts as a gate oxide layer for pixel devices (e.g., transistors) disposed over the substrate 103. An inter-layer dielectric (ILD) layer 119 is over the substrate 103. A plurality of contacts 122 are disposed over contact regions and/or electrodes within/over the substrate 103 and electrically coupling the contact regions and/or electrodes to overlying conductive layers. A plurality of conductive wires and conductive vias 124, 126 are within a second IMD layer 120 and are electrically coupled to the plurality of contacts 122.

Figure 2:
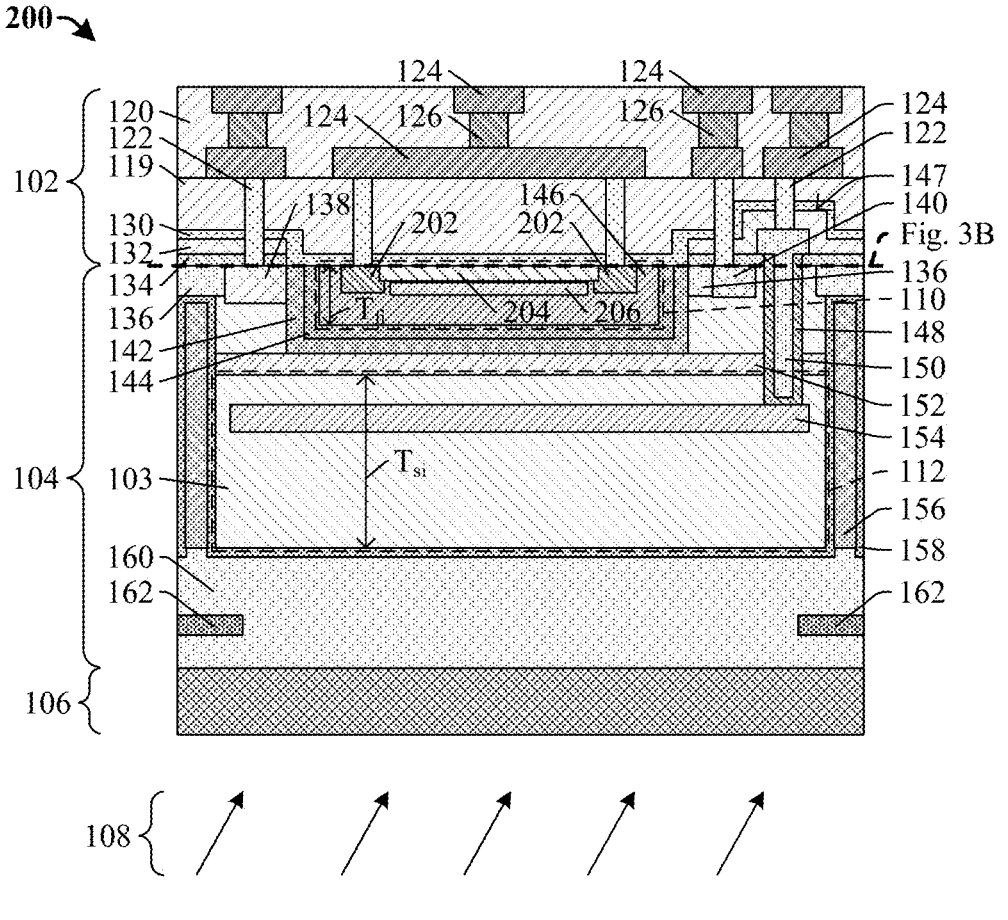
FIG. 2 illustrates a cross-sectional view of some embodiments of a stacked image sensor device comprising a first image sensor element configured as a single photon avalanche diode (SPAD) and a second image sensor element.

With reference to FIG. 2, a cross-sectional view of a stacked image sensor device 200 according to some alternative embodiments of the stacked image sensor device 100 of FIG. 1.

The stacked image sensor device 200 includes the first and second image sensor elements 110, 112 within a substrate 103. The substrate 103 may be, for example, a bulk substrate (e.g., a bulk silicon substrate), a silicon-on-insulator (SOI) substrate, P doped silicon, or N doped silicon. In some embodiments, the substrate 103 is lightly doped with dopants of a first conductivity type (e.g., P-type). The first image sensor element 110 is configured as a single photon avalanche diode (SPAD) which can detect incident radiation with very low intensities (e.g., a single photon). In some embodiments, the first image sensor element 110 may, for example, be used in a near IR (NIR) direct-time of flight (D-TOF) application. In some embodiments, the active layer 146 is lightly doped with dopants of the first conductivity type. The active layer 146 comprise a first deep well 206 of the first conductivity type and a first heavily doped region 204 of a second conductivity type (e.g., N-type) opposite to the first conductivity type. The first deep well 206 is disposed beneath the first heavily doped region 204. A multiplication junction region is formed at an interface between the first heavily doped region 204 and the first deep well 206. In some embodiments, the first deep well 206 is vertically spaced from the first heavily doped region 204 such that the multiplication junction region is formed at an interface between the first heavily doped region 204 and the active layer 146.

In some embodiments, the first image sensor element 110 further comprises a second deep well 202 heavily doped with dopants of the first conductivity type. The second deep well 202 extends from an upper surface of the substrate 103 past a lower surface of the first deep well 206. The second deep well 202 is configured as a guard ring to prevent premature edge break down of the first image sensor element 110 in the SPAD configuration. In some embodiments, the contact region 138 is heavily doped with the dopants of the first conductivity type and functions as one electrode (e.g., an anode) of the first image sensor element 110 and may, for example, be coupled to ground. In some embodiments, another contact region heavily doped with dopants of the second conductivity type is disposed adjacent to the active layer 146 and functions as a second electrode (e.g., a cathode) of the first image sensor 110.

In some embodiments, the buffer layer 144 and the top isolation structure 142 comprise the same dopants and doping concentrations as the active layer 146. In some embodiments, the buffer layer 144 and the top isolation structure 142 are omitted such that the active layer 146 directly contacts the contact region 138, the middle isolation region 152, and a segment of the STI structure 136 (not shown). In some embodiments, dopants of the first conductivity type are P-type (e.g., boron, some other suitable P-type dopants, or any combination of the foregoing) and dopants of the second conductivity type are N-type (e.g., arsenic, phosphorus, some other suitable N-type dopants, or any combination of the foregoing), or vice versa.

In some embodiments, during operation in the SPAD configuration, the first image sensor element 110 is reverse biased above its breakdown voltage, and incident photons in the first range of wavelengths from the electromagnetic radiation 108 strike the first image sensor element 110 to generate carriers. The photon-generated carries move to the multiplication junction region and trigger an avalanche current that amplifies the signals generated by the photons so that they are easier to detect. In some embodiments, a doping type and/or concentration of the first deep well 206 can be configured to adjust the breakdown voltage of the first image sensor element 110 in the SPAD configuration.

In some embodiments, during operation of the first image sensor element 110, the VTX 147 is configured to remove a charge collected in the second image sensor element 112. more specifically from the bottom charge storage region 154. In some embodiments, the bottom charge storage region 154 comprises dopants of the first conductivity type. In some embodiments, the gate electrode 150 may, for example, be or comprise polysilicon, aluminum, copper, or the like. In some embodiments, the gate dielectric layer 148 may, for example, be or comprise silicon oxide, a high-k material, or the like. In some embodiments, the first floating node 140 is highly doped with dopants of the second conductivity type and configured to convert carriers (e.g., photons) from the second wavelength range to an electrical signal.

The active layer 146 comprising the first material (e.g., germanium) may increase the first image sensor element's 110 ability to absorb the first wavelength range (e.g., in an NIR configuration the first wavelength range is approximately 800 to 2,500 nanometers). The first material has a higher absorption of the first wavelength range than alternative materials such as, for example, the second material (e.g., silicon). A thin thickness $T_{fi}$ (e.g., within a range of approximately 0.3 to 1.5 micrometers) of the active layer 146 ensures that the first image sensor element 110 in the SPAD configuration has high NIR sensitivity. The thin thickness $T_{fi}$ allows for a profile small enough to achieve placement of pixel devices (such as VTX 147) laterally offset from the first image sensor element 110 and within inner sidewalls of the passivation layer 158. The profile provides sufficient electrical isolation between the first sensor element 110 and the pixel devices and/or the second image sensor element 112. Further, the first material may, for example, allow the first image sensor element 110 to operate at a low voltage (e.g., less than 10 volts) while in the SPAD configuration. In some embodiments, if, for example, the first image sensor element 110 comprises the second material, then operation in the SPAD configuration may have a high voltage greater than approximately 14 volts (not shown). This high voltage may, for example, increase the number of isolation structures within the substrate 103 to achieve the same electrical isolation, thereby increasing the profile of the first image sensor element 110 and costs to manufacture the device (not shown).

The second image sensor element 112 comprising the second material (e.g., silicon) ensures a high absorption of the second wavelength range while allowing the first wavelength range to pass through to the first image sensor element 110. A thickness $T_{si}$ of the second image sensor element 112 is within a range of approximately 3 to 6 micrometers. In some embodiments, the thickness $T_{si}$ is at least 3 micrometers to ensure acceptable absorption of the second wavelength range (e.g., acceptable QE). In some embodiments, the first wavelength range includes the IR-A range (approximately 800-1400 nanometers). In some embodiments, when a wavelength of the first wavelength range is less than approximately 1000 nanometers the thickness $T_{si}$ is less than 6 micrometers. This, in turn, reduces the interference of the first wavelength range with the electrical signal produced by the second image sensor element 112, thereby decreasing cross-talk between the first and second image sensor elements 110, 112. The decreased cross-talk increases image formation accuracy while maintaining high IR sensitivity in the first image sensor element 110. Further, when the first wavelength range includes the IR-A range and a wavelength of greater than approximately 1100 nanometers a textured back side illumination (BSI) structure may be disposed between the second image sensor element 112 and the electromagnetic radiation 108 to increase the NIR sensitivity (not shown). Therefore, the stacked image sensor device 200 comprises a first and second image sensor elements 110, 112 disposed on a first IC die 104. The first and second image sensor elements 110, 112 are configured to process IR and visible light with high QE and low cross-talk.

In some embodiments, the interconnect structure 102 provides electrical coupling from readout circuitry and/or control/logic circuits to the first and second image sensor elements 110, 112 through contact regions and/or pixel devices (e.g., transistors) disposed over/within the substrate 103. In some embodiments, the interconnect structure 102 provides electrical coupling to other IC dies electrically coupled to the interconnect structure 102 via a bonding structure. In some embodiments, the plurality of conductive wires 124, the plurality of contacts 122, and/or the plurality of conductive vias 126 may, for example, be or comprise tantalum nitride. The electromagnetic radiation 108 disposed upon an opposite side of the interconnect structure 102 mitigates a loss of the first wavelength range because of absorption by a material of the conductive materials in the interconnect structure 102 (such as tantalum nitride).

In some embodiments, the STI structure 136 includes multiple segments, each comprising a dielectric material, and/or is a deep trench isolation structure (DTI), or some other suitable isolation structure. The middle isolation region 152 comprises dopants of the first conductivity type and is configured to provide electrical isolation between the first and second image sensor elements 110, 112. In some embodiments, the middle isolation region 152 extends between inner sidewalls of the passivation layer 158. In some embodiments, the trench dielectric layer 156 may, for example, be or comprise silicon oxide. In some embodiments, the passivation layer 158 extends across a lower surface of the substrate 103. In yet another embodiment, the passivation layer 158 does not extend across the lower surface of the substrate 103 such that the IMD layer 160 directly contacts the lower surface of the substrate 103 (not shown). The dual band-pass filter 106 is in direct contact with the IMD layer 160 and is configured to pass the first and second wavelength ranges and reflect wavelengths of the electromagnetic radiation 108 outside of the first and second wavelength ranges.

With reference to FIG. 3A, a circuit diagram 300a of some embodiments of the stacked image sensor device 200 of FIG. 2.

The circuit diagram 300a represents some embodiments of receiving and processing the electromagnetic radiation 108 disposed upon the second image sensor element 112. A VTX 147 is configured to remove/transfer charge collected from the electromagnetic radiation 108 within the bottom charge storage region (154 of FIG. 2) of the second image sensor element 112 to the first floating node (140 of FIG. 2). A transmit (TX) voltage is applied to a TX node 302 electrically coupled to a VTX gate electrode (150 of FIG. 2) of the VTX 147 to control the transfer of charge from the second image sensor element 112 to a first node 304. The first node 304 is electrically coupled to the first floating node (140 of FIG. 2), a first source/drain region of a reset (RST) transistor 308, and a gate electrode of a source follower (SF) transistor 312. A RST voltage is applied to a second node 306 electrically coupled to a gate electrode of the RST transistor 308. A second source/drain region of the RST transistor 308 is electrically coupled to a third node 310. In some embodiments, the third node 310 is electrically coupled to a power supply supplying a voltage (Vcc). A first source/drain region of the SF transistor 312 is electrically coupled to the third node 310. A second source/drain region of the SF transistor 312 is electrically coupled to a fourth node 314. A first source/drain region of a select (SEL) transistor 316 is electrically coupled to the fourth node 314. A second source/drain region of the SEL transistor 316 is electrically coupled to a column line 320 (e.g., word line). A SEL voltage is applied to a gate electrode of the SEL transistor 316 by way of a row line 318 (e.g., bit line) electrically coupled to the gate electrode of the SEL transistor 316.

In some embodiments, during operation, if a charge level is sufficiently high within the bottom charge storage region (154 of FIG. 2) while the VTX transistor 147 is activated, the SF transistor 312 is activated and charges are selectively output according to operation of the SEL transistor 316 used for addressing. The RST transistor 308 can be used to reset the second image sensor element (112 of FIG. 2) between exposure periods.

With reference to FIG. 3B, some embodiments of a top view 300b of the stacked image sensor device 200 of FIG. 2 according to a cut-line in FIG. 2. The cut-line continuously extends across a top surface of the substrate (103 of FIG. 2).

The top view 300b shows a layout of the regions/layers in and/or around the active layer 146. Connections are shown between a substrate 103 and terminal and/or node connections. While not shown, connections between the substrate 103 and terminal and/or node connections may, for example, be achieved by a back-end-of-line (BEOL) interconnect structure (e.g., the interconnect structure 102 of FIG. 2) overlying source/drain regions within the substrate 103 and gate terminals overlying the substrate 103.

A first transistor region 301 is laterally offset from the top isolation structure 142 between outer sidewalls of the top isolation structure 142 and within outer sidewalls of a segment of the STI structure 136. The first transistor region 301 comprises a plurality of source/drain regions 322 and a plurality of gate electrodes 324. The VTX gate electrode 150 is electrically coupled to the TX node 302. The first floating node 140 is electrically coupled to a source/drain region 322 of the RST transistor 308 and a gate electrode 324 of the SF transistor 312 through the first node 304. A gate electrode 324 of the RST transistor 308 is electrically coupled to the second node 306. A source/drain region 322 of the RST transistor 308 and a source/drain region 322 of the SF transistor 312 are electrically coupled to the third node 310. A source/drain region 322 of the SF transistor 312 and a source/drain region 322 of the SEL transistor 316 are electrically coupled to the fourth node 314. A gate electrode 324 of the SEL transistor 316 is electrically coupled to a row line 318. A source/drain region of the SEL transistor 316 is electrically coupled to a column line 320 (e.g., an output line).

In various embodiments, the transistors within the first transistor region 301 are not between the electromagnetic radiation 108 and the active layer 146. In various embodiments, outer sidewalls of the transistors within the first transistor region 301 are within inner sidewalls of the passivation layer 158. In yet another embodiment, transistors within the first transistor region 301 are on another IC die electrically coupled to the first IC die (104 of FIG. 2) via the interconnect structure (102 of FIG. 2). In various embodiments, the plurality of source/drain regions 322 may, for example, be or comprise silicon with a P-type or N-type dopant, respectively. In various embodiments, the plurality of gate electrodes 324 may, for example, be or comprise poly-silicon, aluminum, copper, or the like and may be disposed over or within the substrate 103.

Figures 4, 5:
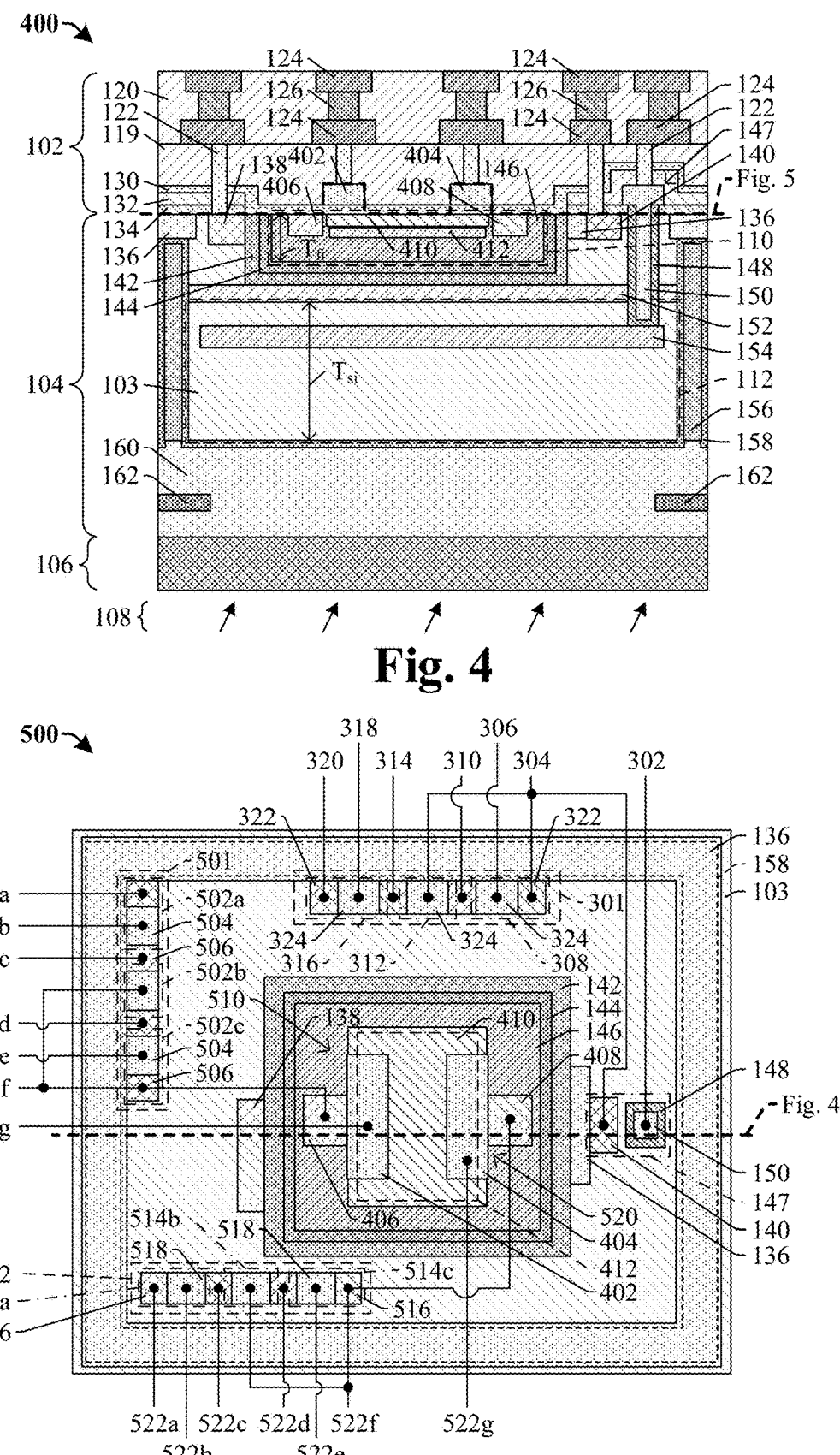
FIG. 4 illustrates a cross-sectional view of some embodiments of a stacked image sensor device comprising a first image sensor element configured as a phase-detection (PD) time-of-flight (TOF) (PD-TOF) photodiode or a pinned photo diode (PPD) overlying a second image sensor element.
FIG. 5 illustrates a top view of some embodiments of the stacked image sensor device of FIG. 4, as indicated by the cut-line in FIG. 4.

With reference to FIG. 4, a cross-sectional view of a stacked image sensor device 400 according to some alternative embodiments of the stacked image sensor device 200 of FIG. 2.

The stacked image sensor device 400 includes the first and second image sensor elements 110, 112 within a substrate 103. In some embodiments, the substrate 103 is lightly doped with dopants of a first conductivity type (e.g., P-type). In some embodiments the first image sensor element 110 is configured as a phase-detection (PD) time-of-flight (TOF) (PD-TOF) photodiode for NIR radiation. In yet another embodiment, the first image sensor element 110 is configured as a pinned photo diode (PPD) for NIR radiation. In some embodiments, the active layer 146 is lightly doped with dopants of the first conductivity type. The active layer 146 comprises a first heavily doped region 410 of the first conductivity type and a first deep well 412 of a second conductivity type (e.g., N-type) opposite to the first conductivity type. A double P-N junction exists in the active layer 146 between the first deep well 412 and the first heavily doped region 410 and between the first deep well 412 and the active layer 146. In some embodiments, the first heavily doped region 410 may, for example, function as a surface pinning layer that limits the maximum PPD channel potential. In some embodiments, outer sidewalls of the first deep well 412 are within outer sidewalls of the first heavily doped region 410. A first floating node 406 is separated from a second floating node 408 by the first heavily doped region 410. In some embodiments, the first and second floating nodes 406, 408 comprise the second conductivity type. In some embodiments, the first and second floating nodes 406, 408 are laterally offset from the first heavily doped region 410 by a non-zero distance, respectively.

In some embodiments, during operation, incident photons in the first range of wavelengths are illuminated upon the first image sensor element 110 generating carriers. The first deep well 412 acts as a charge storage layer collecting the photon-generated carriers which may, for example, travel to the first floating node 406 and/or the second floating node 408. In some embodiments, applying a proper bias to a first transistor electrode 402 controls a depletion region directly beneath the first transistor electrode 402 and selectively allows or prevents the flow of the photon-generated carriers from the first deep well 412 to the first floating node 406. In some embodiments, applying a proper bias to a second transistor electrode 404 controls a depletion region directly beneath the second transistor electrode 404 and selectively allows or prevents the flow of the photon-generated carriers from the first deep well 412 to the second floating node 408. In some embodiments, the contact region 138 is heavily doped with the dopants of the first conductivity type and functions as a substrate bias contact to apply a bias to the substrate 103. In some embodiments, the first and second transistor electrodes 402, 404 may, for example, be or comprise polysilicon, aluminum, copper, or the like.

With reference to FIG. 5, some embodiments of a top view 500 of the stacked image sensor device 400 of FIG. 4 according to a cut-line in FIG. 4. The cut-line continuously extends across a top surface of the contact region (138 of FIG. 4) to a top surface of the first floating node (406 of FIG. 4), to a top surface of the first transistor electrode (402 of FIG. 4), to a top surface of the first heavily doped region (410 of FIG. 4) between the first and second transistor electrodes (402, 404 of FIG. 4), to a top surface of the second transistor electrode (404 of FIG. 4), and finally from a top surface of the second floating node (408 of FIG. 4) to a segment of the STI structure (136 of FIG. 4).

The top view 500 shows a layout of the regions/layers in and/or around the active layer 146. Connections are shown between a substrate 103 and terminal and/or node connections. While not shown, connections between the substrate 103 and terminal and/or node connections may, for example, be achieved by a back-end-of-line (BEOL) interconnect structure (e.g., the interconnect structure 102 of FIG. 4) overlying source/drain regions within the substrate 103 and gate terminals overlying the substrate 103.

In some embodiments, a first transistor region 301 is as the first transistor region 301 of FIG. 3 is labeled and described above. A second transistor region 501 is laterally offset from the top isolation structure 142 within inner sidewalls of the passivation layer 158. The second transistor region 501 comprises a plurality of first IR transistors 502a, 502b, 502c. The plurality of first IR transistors 502a, 502b, 502c comprise a plurality of first IR gate electrodes 504 and a plurality of first IR source/drain regions 506. The plurality of first IR transistors 502a, 502b, 502c are electrically coupled to a plurality of first IR node connections 508a-508f.

In some embodiments, the second transistor region 501 functions as the first transistor region 301 of FIG. 3 is described. In the aforementioned embodiments, the first transistor electrode 402 acts as a TX gate electrode for a first IR TX transistor 510 such that a TX voltage is applied to the first transistor electrode 402 via a first IR node connection 508g to control the flow of photon-generated carriers from the first deep well 412 to the first floating node 406. The first IR transistor 502c may, for example, be configured to function as a RST transistor. The first IR transistor 502b may, for example, function as a SF transistor. The first IR transistor 502a may, for example, function as a SEL transistor.

A third transistor region 512 is laterally offset from the top isolation structure 142 within inner sidewalls of the passivation layer 158. The third transistor region 512 comprises a plurality of second IR transistors 514a, 514b, 514c. The plurality of second IR transistors 514a, 514b, 514c comprise a plurality of second IR gate electrodes 518 and a plurality of second IR source/drain regions 516. The plurality of second IR transistors 514a, 514b, 514c are electrically coupled to a plurality of second IR node connections 522a-522f.

In some embodiments, the third transistor region 512 functions as the first transistor region 301 of FIG. 3 is described. In the aforementioned embodiments, the second transistor electrode 404 acts as a TX gate electrode for a second IR TX transistor 520 such that a TX voltage is applied to the second transistor electrode 404 via a second IR node connection 522g to control the flow of photon-generated carriers from the first deep well 412 to the second floating node 408. The second IR transistor 514c may, for example, be configured to function as a RST transistor. The second IR transistor 514b may, for example, function as a SF transistor. The second IR transistor 514a may, for example, function as a SEL transistor.

In various embodiments, transistors within the first, second, and third transistor regions 301, 501, 512 are not between the electromagnetic radiation 108 and the active layer 146. In various embodiments, outer sidewalls of the transistors within the first, second, and third transistor regions 301, 501, 512 are within inner sidewalls of the passivation layer 158. In yet another embodiment, transistors within the first, second, and third transistor regions 301, 501, 512 are on another IC die electrically coupled to the first IC die (104 of FIG. 2) via the interconnect structure (102 of FIG. 2).

Figure 6:
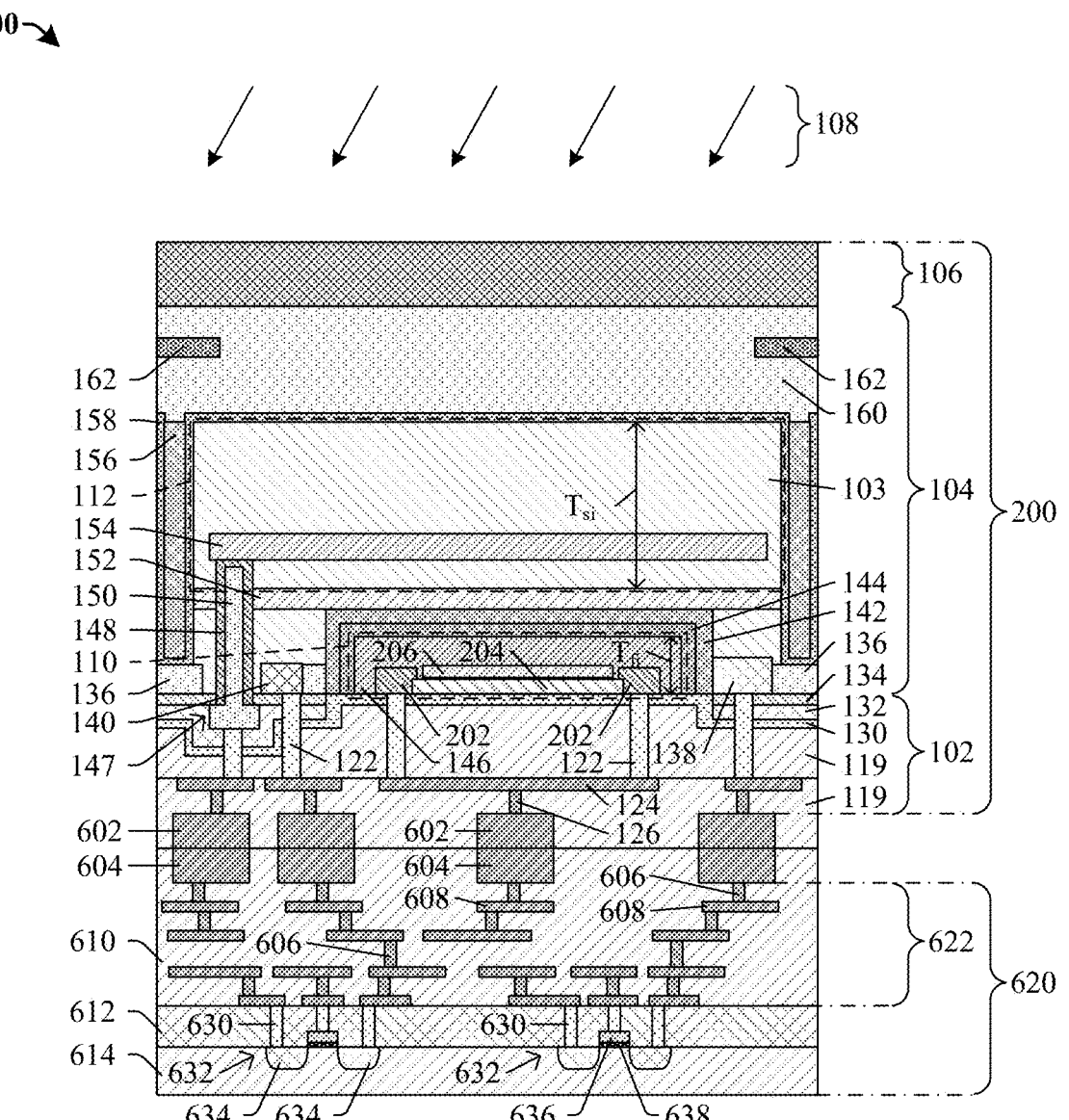
FIG. 6 illustrates a cross-sectional view of some embodiments of the stacked image sensor device of FIG. 2 in a three-dimensional integrated chip (3DIC) comprising logic.

With reference to FIG. 6, a cross-sectional view of a three-dimensional integrated chip (3DIC) 600 according to some alternative embodiments, including the stacked image sensor device 200 of FIG. 2.

The 3DIC 600 comprises the stacked image sensor device 200 of FIG. 2 rotated upside-down, such that the interconnect structure 102 underlies the second image sensor element 112, and bonded to a second IC die 620 by a hybrid bond including a metal-to-metal bond and a dielectric-to-dielectric bond. The metal-to-metal bond (e.g., a diffusion bond) can be between a top metal layer 602 and a bottom metal layer 604. The interconnect structure 102 is electrically coupled to a bottom interconnect structure 622 through the top metal layer 602 and the bottom metal layer 604. The bottom interconnect structure 622 includes a plurality of metal wires 608 and a plurality of metal vias 606 disposed within a bottom IMD layer 610. The bottom interconnect structure 622 provides electrical coupling through a plurality of bottom contacts 630 to a plurality of semiconductor devices 632. In some embodiments, the plurality of semiconductor devices 632 are transistors respectively comprising source/drain regions 634, a gate dielectric layer 638, and a gate electrode 636. The plurality of bottom contacts 630 are within a bottom ILD layer 612 and the plurality of semiconductor devices 632 are within/over a bottom substrate 614. The dielectric-to-dielectric bond can be between the ILD layer 119 and the bottom IMD layer 610 such that the ILD layer 119 and the bottom IMD layer 610 are in direct contact with one another. The top and bottom metal layers 602, 604 function as a pair of bonding pads and can include re-distribution layers (RDLs). In some embodiments, the dielectric-to-dielectric bond is an oxide-to-oxide bond.

FIGS. 7-16 illustrate cross-sectional views 700-1600 of some embodiments of forming a 3DIC comprising a stacked image sensor device. Although the cross-sectional views 700-1600 shown in FIGS. 7-16 are described with reference to a method of forming a 3DIC comprising a stacked image sensor device, it will be appreciated that the structures shown in FIGS. 7-16 are not limited to the method of formation but rather may stand alone separate of the method.

Figure 7:
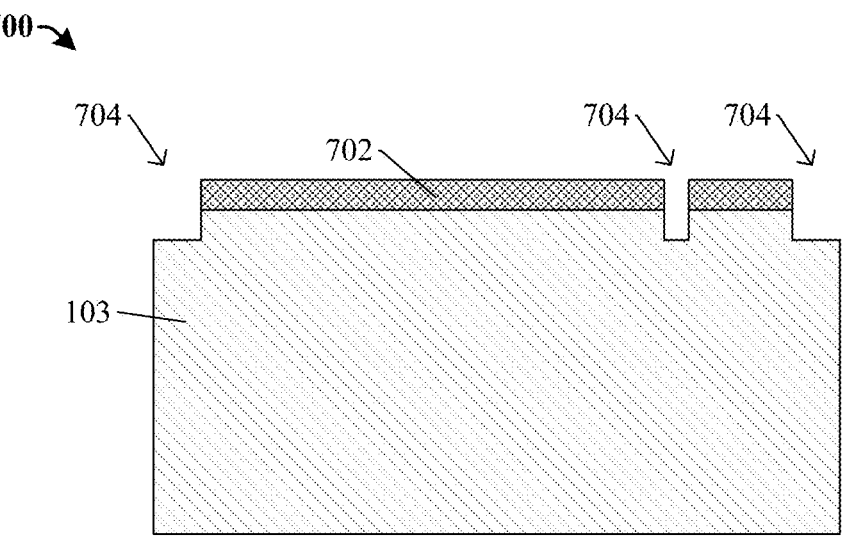
FIGS. 7-16 illustrate cross-sectional views of some embodiments of a method of forming a stacked image sensor comprising a first image sensor element underlying a second image sensor element.

As shown in cross-sectional view 700 of FIG. 7, a first etch process is performed on a substrate 103 according to a hard mask 702. The first etching process is performed by exposing unmasked regions of the substrate 103 to one or more etchants, which remove parts of the substrate 103 in the unmasked regions to define trenches 704 within the substrate 103. In some embodiments, the substrate 103 may, for example, be a bulk substrate (e.g., a bulk silicon substrate), a silicon-on-insulator (SOI) substrate doped with boron or some other suitable P-type dopants with a concentration of approximately less than $1 \times 10^{16}$ atoms per cubic centimeter (atoms/cm$^3$).

Figure 8:
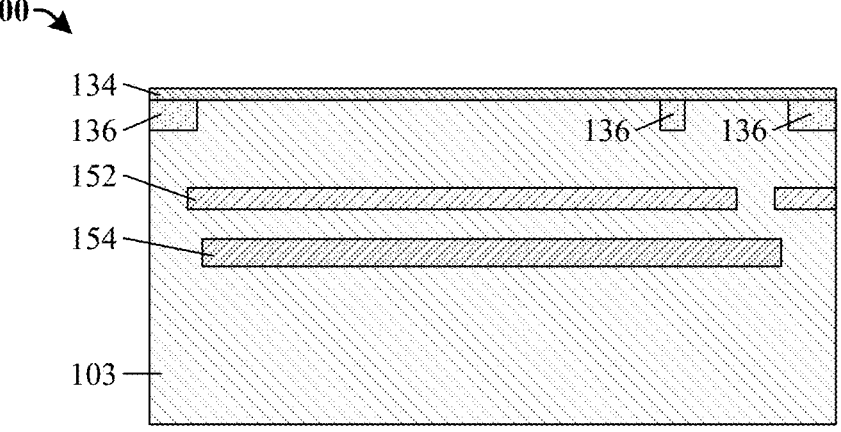

As shown in cross-sectional view 800 of FIG. 8, one or more dielectric layers are formed within the trenches (704 of FIG. 7). A planarization process (e.g., a chemical-mechanical planarization (CMP) process) is subsequently performed on the one or more dielectric layers defining a shallow trench isolation (STI) structure 136 comprising multiple segments within the substrate 103. A middle isolation region 152 is formed within the substrate 103. A bottom charge storage region 154 is formed within the substrate 103 beneath the middle isolation region 152. In some embodiments, a rapid thermal annealing (RTA) process is performed on the substrate 103, for example, to repair any damage to the substrate 103 from forming the bottom charge storage region 154 and/or from forming the middle isolation region 152. A first dielectric layer 134 is formed over the substrate 103.

In some embodiments, the one or more dielectric layers may comprise an oxide (e.g., silicon oxide), TEOS, or the like. In some embodiments, the one or more dielectric layers may be deposited by a physical vapor deposition technique (e.g., PVD, CVD, PE-CVD, ALD, or the like). In some embodiments, the middle isolation region 152 may, for example, comprise boron or some other suitable P-type dopants with a concentration of approximately $1 \times 10^{18}$ to approximately $5 \times 10^{18}$ atoms/cm$^3$. In some embodiments, the bottom charge storage region 154 may, for example, comprise arsenic, phosphorus, some other suitable N-type dopants, or any combination of the foregoing with a concentration of approximately $1 \times 10^{16}$ to approximately $4 \times 10^{17}$ atoms/cm$^3$. In some embodiments, the first dielectric layer 134 may, for example, be or comprise silicon oxide, high-k dielectric layer, or the like.

Figure 9:
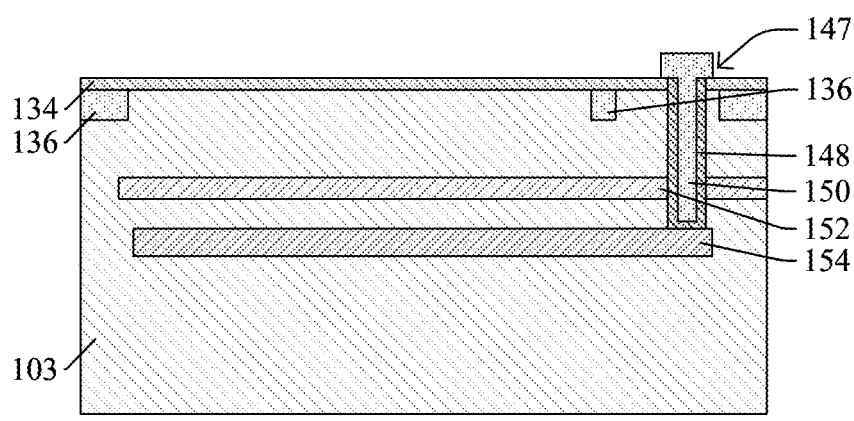

As shown in cross-sectional view 900 of FIG. 9, a vertical transistor (VTX) 147 is formed within the substrate 103. In some embodiments, the VTX 147 is formed by forming a masking layer over the substrate 103 and performing an etching process according to the masking layer defining an opening and exposing an upper surface of the bottom charge storage region 154 (not shown). A VTX gate dielectric 148 is formed within the opening and directly contacts the upper surface of the bottom charge storage region 154. A VTX gate electrode 150 is formed within the substrate 103 such that the VTX gate dielectric 148 surrounds the VTX gate electrode 150. In some embodiments, the VTX gate dielectric 148 may, for example, be or comprise silicon oxide, a high-k material, or the like. In some embodiments, the VTX gate electrode 150 may, for example, be or comprise polysilicon, aluminum, copper, or the like.

Figure 10:
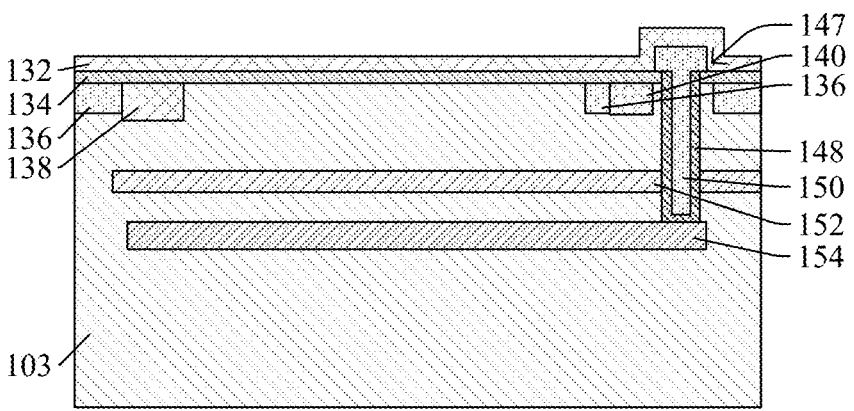

As shown in cross-sectional view 1000 of FIG. 10, a first floating node 140 is formed within the substrate 103 between a segment of the STI structure 136 and the VTX 147. A first contact region 138 is formed within the substrate 103, laterally offset by a non-zero distance from the segment of the STI structure 136 adjacent to the first floating node 140. A second RTA process is performed on the substrate 103, for example, to repair any damage to the substrate 103 from forming the first floating node 140 and/or from forming the contact region 138. A second dielectric layer 132 is formed over the substrate 103. In some embodiments, the first floating node 140 may, for example, comprise arsenic, phosphorus, some other suitable N-type dopants, or any combination of the foregoing with a concentration of approximately $1 \times 10^{18}$ to approximately $1 \times 10^{19}$ atoms/cm$^3$. In some embodiments, the first contact region 138 may, for example, comprise boron or some other suitable P-type dopants with a concentration of approximately $1 \times 10^{18}$ to approximately $1 \times 10^{19}$ atoms/cm$^3$. In some embodiments, the second dielectric layer 132 may, for example, be or comprise silicon oxide, high-k dielectric layer, or the like.

Figure 11:
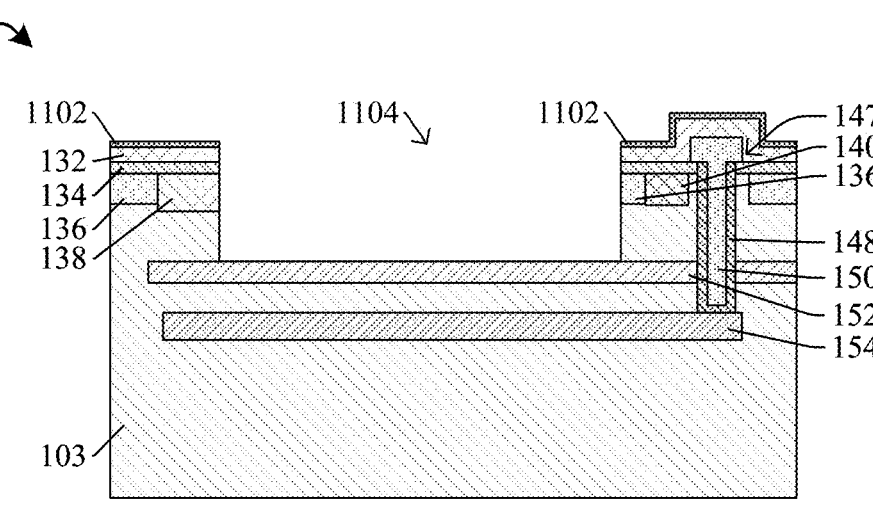

As shown in cross-sectional view 1100 of FIG. 11, a second etch process is performed according to a hard mask 1102 to remove a portion of the first and second dielectric layers 134, 132 and the substrate 103 defining an opening 1104 within the substrate 103. The second etch process exposes an upper surface of the middle isolation region 152.

Figure 12:
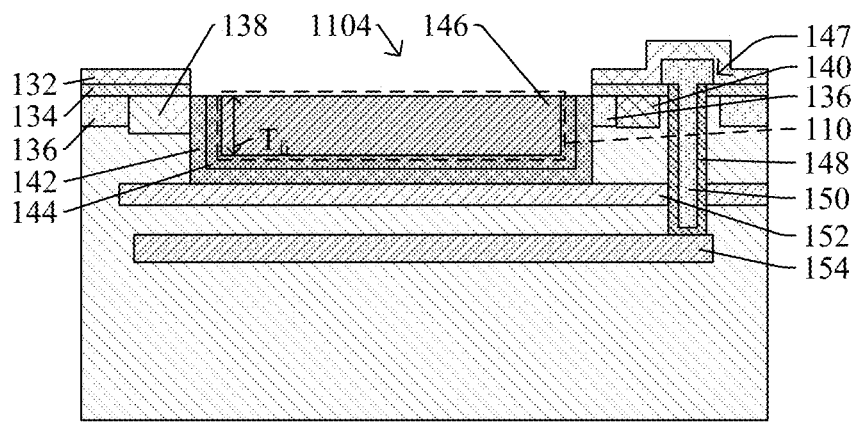

As shown in cross-sectional view 1200 of FIG. 12, a top isolation structure 142 is formed within the opening 1104 over the upper surface of the middle isolation region 152. A buffer layer 144 is selectively grown within the opening 1104 over the top isolation structure 142. An active layer 146 of a first image sensor element 110 is formed within the opening 1104 over the buffer layer 144. In some embodiments, the top isolation structure 142, the buffer layer 144, and/or the active layer 146 may, for example, be formed by MBE, VPE, LPE, some other suitable epitaxial process, or any combination of the foregoing. In some embodiments, a planarization process (e.g., a CMP process) is performed on the top isolation structure 142, the buffer layer 144, and/or the active layer 146 such that an upper surface of the aforementioned layers are aligned with an upper surface of the substrate 103.

In some embodiments, the top isolation structure 142 may, for example, be or comprise silicon doped with boron or some other suitable P-type dopants with a concentration of approximately $1 \times 10^{18}$ to approximately $1 \times 10^{19}$ atoms/cm$^3$. In some embodiments, the buffer layer 144 may, for example, be or comprise silicon germanium doped with boron or some other suitable P-type dopants with a concentration of approximately $3 \times 10^{16}$ atoms/cm$^3$ or less. In some embodiments, the buffer layer is comprised of a first material (e.g., germanium) and a second material (e.g., silicon) such that a concentration of the second material continuously decreases from an inner surface of the top isolation structure 142 to an outer surface of the active layer 146 and a concentration of the first material continuously increases from the inner surface of the top isolation structure 142 to the outer surface of the active layer 146. In some embodiments, the active layer 146 may, for example, be or comprise germanium doped with boron or some other suitable P-type dopants with a concentration of approximately $3\times10^{16}$ atoms/cm$^3$ or less. In some embodiments, the active layer 146 may, for example, be formed to a thickness $T_{fi}$ within a range of approximately 0.3 micrometers to approximately 1.5 micrometers. In some embodiments, the thickness $T_{fi}$ is defined from a top surface of the active layer 146 to a bottom surface of the top isolation structure 142 (not shown).

Figure 13:
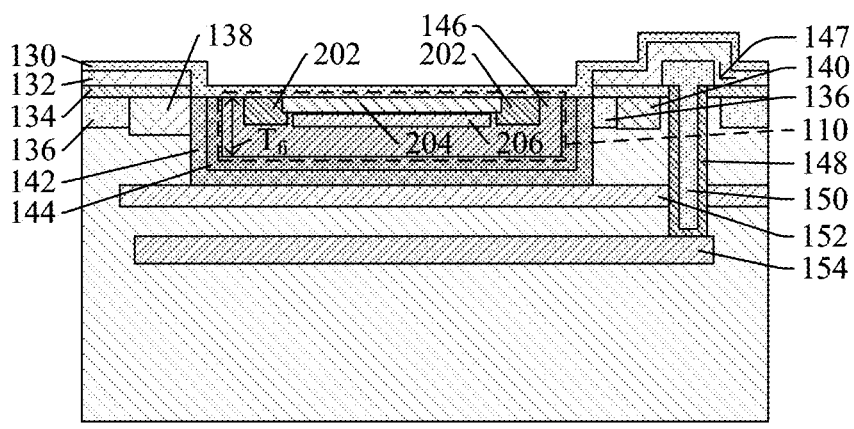

As shown in cross-sectional view 1300 of FIG. 13, a third dielectric layer 130 is formed over the first and second dielectric layers 134, 132 and the substrate 103. An implant process is performed to form doped regions within the active layer 146. In some embodiments, the implant process is performed to form the first image sensor element 110 of FIG. 4 such that the first image sensor element 110 is in a PPD or a PD-TOF configuration for NIR radiation (not shown). In yet another embodiment, the implant process is performed to form the first image sensor element 110 of FIG. 2 such that the first image sensor element 110 is in a SPAD configuration. In the aforementioned embodiment, a first heavily doped region 204 is formed, a first deep well 206 is formed under the first heavily doped region 204, and a second deep well 202 is formed around the first heavily doped region 204.

In some embodiments, the third dielectric layer 130 may, for example, be or comprise silicon oxide, a high-k dielectric material (e.g., dielectric constant greater than 3.9), or the like. In some embodiments, the third dielectric layer 130 may act as a gate oxide layer. In some embodiments, the first heavily doped region 204 is formed by doping the active layer 146 with arsenic, phosphorus, some other suitable N-type dopants, or any combination of the foregoing with a concentration of approximately $1\times10^{18}$ to approximately $1\times10^{19}$ atoms/cm$^3$. In some embodiments, the first deep well 206 is formed by doping the active layer 146 with boron or some other suitable P-type dopants with a concentration of approximately $1\times10^{16}$ to approximately $1\times10^{18}$ atoms/cm$^3$. In some embodiments, the second deep well 202 is formed by doping the active layer 146 with boron or some other suitable P-type dopants with a concentration of approximately $1\times10^{18}$ to approximately $1\times10^{19}$ atoms/cm$^3$. In some embodiments, the second deep well 202 is formed before the third dielectric layer 130 by performing an etch process according to a hard mask formed over the active layer 146 defining a guard ring opening, forming the second material (silicon) within the guard ring opening, and performing a planarization process (not shown).

Figure 14:
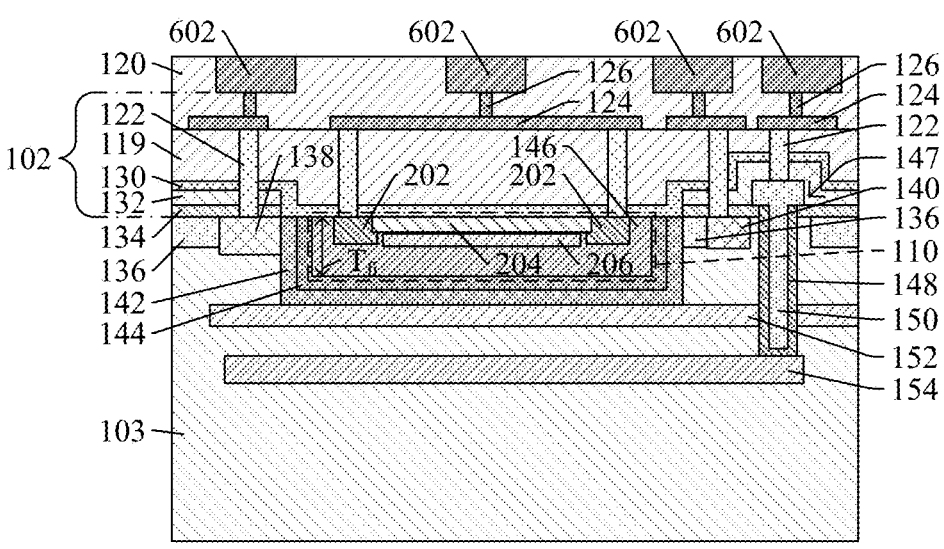

As shown in cross-sectional view 1400 of FIG. 14, an interconnect structure 102 is formed over the substrate 103. Formation of the interconnect structure 102 includes forming an ILD layer 119 over the third dielectric layer 130, a plurality of contacts 122 are formed within the ILD layer 119 in direct contact with contact regions within the substrate 103 and/or electrodes over the substrate 103, a second IMD layer 120 is formed over the ILD layer 119, a plurality of conductive wires 124 and a plurality of conductive vias 126 are formed within the second IMD layer 120. A top metal layer 602 is formed within the second IMD layer 120.

In some embodiments, the plurality of conductive wires 124 may, for example, be or comprise copper, aluminum, tantalum nitride, or the like, respectively. In some embodiments, the plurality of conductive vias 126 may, for example, be or comprise copper, aluminum, tantalum nitride, or the like, respectively. In some embodiments, the plurality of contacts 122 may, for example, be or comprise copper, aluminum, tantalum nitride, or the like, respectively.

Figure 15:
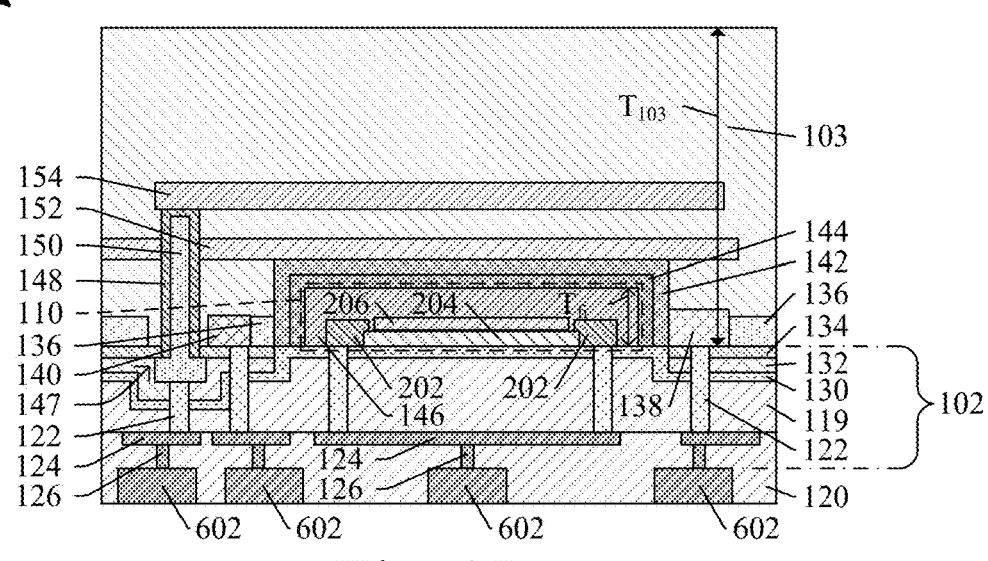

As shown in cross-sectional view 1500 of FIG. 15, the structure of the cross-sectional view 1400 of FIG. 14 is rotated 180 degrees. In some embodiments, a thickness $T_{103}$ of the substrate 103 is within a range of approximately 20 to 30 micrometers.

Figure 16:
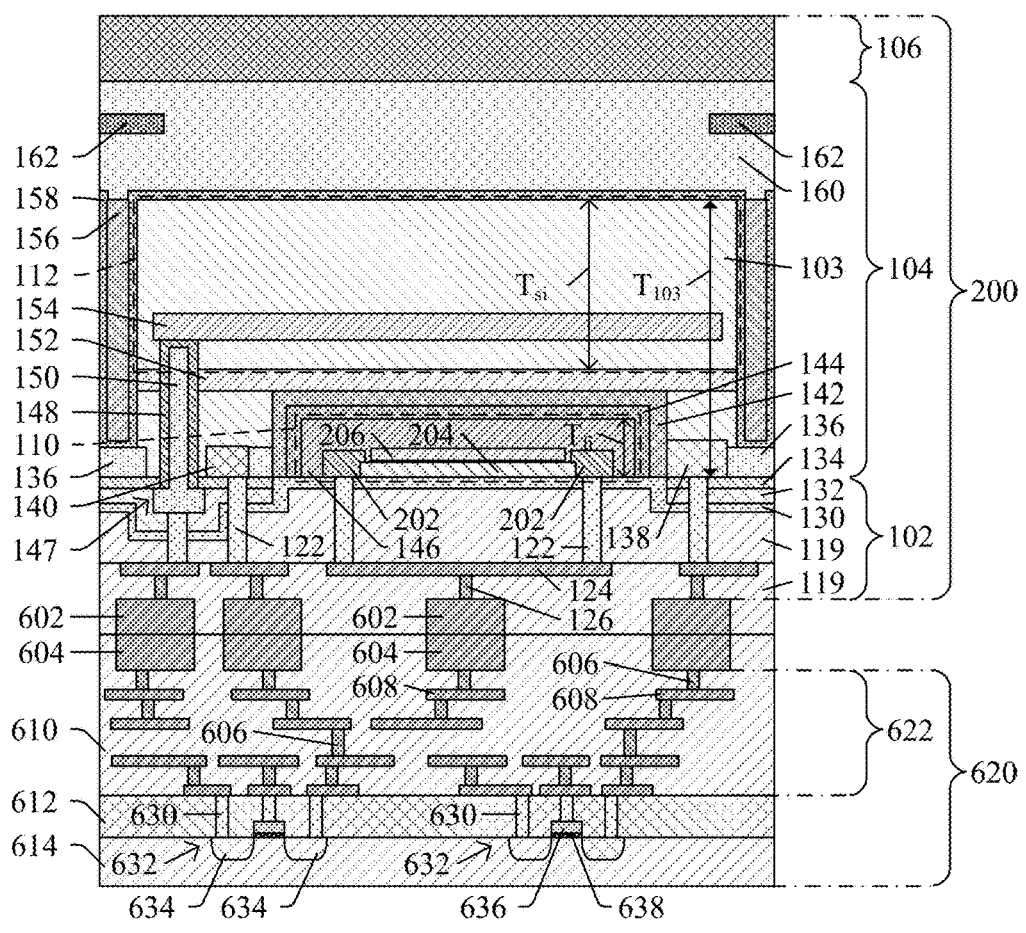

As shown in cross-sectional view 1600 of FIG. 16, the structure of the cross-sectional view 1500 of FIG. 15 is bonded to the second IC die 620. In some embodiments, the bonding process may form a hybrid bond including a metal-to-metal bond and a dielectric-to-dielectric bond. The top metal layer 602 and the bottom metal layer 604 can be bonded together in direct contact with one another. The ILD layer 119 and the bottom ILD layer 610 can abut one another to define a dielectric-to-dielectric bond of the hybrid bond. In some embodiments, the dielectric-to-dielectric bond is an oxide-to-oxide bond. In some other embodiments, the bonding process may use an intermediate bonding oxide layer (not shown) arranged between the ILD layer 119 and the bottom ILD layer 610. Through the bonding, the first image sensor element 110 and the second image sensor element 112 are correspondingly coupled to the plurality of semiconductor devices 632 through the interconnect structure 102 and the bottom interconnect structure 622.

Further, as shown in the cross-sectional view 1600 of FIG. 16, the substrate 103 is thinned by etching and/or mechanical grinding process. In some embodiments, the thinning process is performed directly after the bonding process. In some embodiments, the thickness $T_{103}$ is reduced by approximately 10 to 15 micrometers. A backside deep trench isolation (BDTI) structure is formed within the substrate 103 including a passivation layer 158 and a trench dielectric layer 156 defining the second image sensor element 112. In some embodiments, a planarization process is performed on the BDTI structure, including the passivation layer 158 and the trench dielectric layer 156. The IMD layer 160 is formed over the passivation layer 158. Backside shielding structures 162 are formed within the IMD layer 160. The dual bandpass filter 106 is formed over the IMD layer 160.

In some embodiments, the second image sensor element 112 may, for example, be or comprise silicon doped with boron or some other suitable P-type dopants with a concentration of approximately less than $1\times10^{16}$ atoms/cm$^3$ with a thickness $T_{si}$ within a range of approximately 3 to 6 micrometers. In various embodiments, the passivation layer 158 may, for example, be or comprise silicon oxide, or the like. In various embodiments, the trench dielectric layer 156 may, for example, be or comprise a high-k material, or the like. In some embodiments, the backside shielding structures 162 may, for example, be or comprise aluminum, copper, tungsten, or the like.

FIG. 17 illustrates a flow diagram of some additional embodiments of a method 1700 of a 3DIC comprising a stacked image sensor device.

While disclosed method 1700 is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 1702, a shallow trench isolation (STI) structure is formed within a substrate. FIGS. 7-8 illustrate cross-sectional views corresponding to some embodiments corresponding to act 1702.

At 1704, a first charge storage region is formed within a second image sensor region of the substrate. FIG. 8 illustrates a cross-sectional view corresponding to some embodiments corresponding to act 1704.

At 1706, an isolation region is formed between the second image sensor region and a top surface of the substrate. FIG. 8 illustrates a cross-sectional view corresponding to some embodiments corresponding to act 1706.

At 1708, contact regions and a vertical transistor (VTX) are formed within the substrate. FIGS. 9-10 illustrate cross-sectional views corresponding to some embodiments corresponding to act 1708.

At 1710, an etch process is performed to form an opening between the contact regions within the substrate defining a first image sensor region. FIG. 11 illustrates a cross-sectional view corresponding to some embodiments corresponding to act 1710.

At 1712, an isolation layer, a buffer layer, and an active layer are formed within the first image sensor region. FIG. 12 illustrates a cross-sectional view corresponding to some embodiments corresponding to act 1712.

At 1714, a dielectric protection layer is formed over the first image sensor region. FIG. 13 illustrates a cross-sectional view corresponding to some embodiments corresponding to act 1714.

At 1716, one or more active regions are formed within the active layer. FIG. 13 illustrates a cross-sectional view corresponding to some embodiments corresponding to act 1716.

At 1718, a first interconnect structure is formed over the substrate. FIG. 14 illustrates a cross-sectional view corresponding to some embodiments corresponding to act 1718.

At 1720, the first interconnect structure is bonded to a second integrated circuit (IC) die. FIG. 16 illustrates a cross-sectional view corresponding to some embodiments corresponding to act 1720.

At 1722, a thin down process is performed on the substrate. FIG. 16 illustrates a cross-sectional view corresponding to some embodiments corresponding to act 1722.

At 1724, an isolation structure is formed around outer sidewalls of the second image sensor region. FIG. 16 illustrates a cross-sectional view corresponding to some embodiments corresponding to act 1724.

At 1726, a dual band-pass filter is formed over the substrate. FIG. 16 illustrates a cross-sectional view corresponding to some embodiments corresponding to act 1726.

In some embodiments, the present disclosure relates to a vertically stacked image sensor comprising a visible light image sensor element made of silicon overlying an IR image sensor made of germanium within a first IC die bonded to a second IC die comprising pixel devices (e.g., transistors).

In some embodiments, the present application provides an image sensor, including: a first image sensor element configured to generate electrical signals from an electromagnetic radiation within a first range of wavelengths; and a second image sensor element over the first image sensor configured to generate electrical signals from the electromagnetic radiation within a second range of wavelengths that is different than the first range of wavelengths; wherein the first and second image sensor elements are disposed within a substrate, wherein the first image sensor element comprises a germanium layer between a bottom surface of the substrate and the second image sensor element, wherein the second image sensor element comprises silicon.

In other embodiments, the present application provides an integrated circuit (IC), including: a first interconnect structure over a first substrate; a second substrate over the first interconnect structure, wherein an isolation layer is disposed between a top and bottom surface of the second substrate; a first image sensor element within the second substrate and in direct contact with a bottom surface of the isolation layer, the first image sensor element comprises an active region configured to generate electrical signals from infrared radiation; and a second image sensor element within the second substrate and in direct contact with a top surface of the isolation layer, the second image sensor element is configured to generate electrical signals from visible light; wherein the active region is comprised of a first material different than a second material the second substrate is comprised of.

In yet other embodiments, the present disclosure provides a method of forming an image sensor, the method including: forming a first image sensor element with a first substrate, wherein the first image sensor element is configured to generate electrical signals from electromagnetic radiation within a first range of wavelengths, wherein the first image sensor element is comprised of silicon; performing an etch process to form an opening above the first image sensor within the first substrate; forming a second image sensor element with the opening, wherein the second image sensor element is configured to generate electrical signals from electromagnetic radiation within a second range of wavelengths different from the first range of wavelengths, wherein the second image sensor element comprises an active layer comprising germanium; performing a planarization process such that a top surface of the active layer is aligned with a top surface of the substrate; forming an interconnect structure above the second image sensor element; and bonding the interconnect structure to a first integrated circuit (IC) die.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated chip, comprising:
    a first image sensor element comprising a first doped region disposed within a substrate, wherein the substrate comprises a first material and has a first surface opposite a second surface;
    a second image sensor element over the first image sensor element, wherein the second image sensor element comprises an active layer disposed in the substrate directly over the first doped region, wherein the first doped region and the active layer are spaced vertically between the first and second surfaces of the substrate, wherein the active layer comprises a second material different from the first material;

a semiconductor layer vertically separating the first image sensor element and the second image sensor element, wherein the semiconductor layer continuously wraps around a bottom surface of the active layer and outer sidewalls of the active layer, wherein the outer sidewalls of the active layer comprise a first sidewall and a second sidewall;

a first plurality of transistors disposed on the first surface of the substrate, wherein the first plurality of transistors are adjacent to the first sidewall and a third sidewall of the active layer; and a second plurality of transistors disposed on the first surface of the substrate, wherein the second plurality of transistors are adjacent to the second sidewall and a fourth sidewall of the active layer, wherein the first sidewall is opposite the second sidewall and the third sidewall is opposite the fourth sidewall.

2. The integrated chip of claim 1, wherein a width of the first doped region is greater than a width of the active layer.

3. The integrated chip of claim 1, further comprising:

a dielectric layer contacting a top surface of the active layer in a cross-sectional view; and wherein the semiconductor layer surrounds an outer perimeter of the active layer in a top view.

4. The integrated chip of claim 1, further comprising:

an isolation structure extending into the first surface of the substrate, wherein the bottom surface of the active layer is vertically below a bottom surface of the isolation structure.

5. The integrated chip of claim 1, wherein the semiconductor layer comprises the first material, and wherein the semiconductor layer and the active layer have a same doping type.

6. The integrated chip of claim 4, further comprising:

a floating diffusion node disposed on the first surface of the substrate, wherein a segment of the isolation structure is disposed laterally between the floating diffusion node and the active layer.

7. The integrated chip of claim 1, wherein the first plurality of transistors are configured to conduct readout of the first image sensor element, wherein the second plurality of transistors are configured to conduct readout of the second image sensor element.

8. An integrated chip, comprising:

a substrate comprising opposing sidewalls defining a trench extending into a first surface of the substrate, wherein the substrate comprises a first material and a second surface opposite the first surface;

a first image sensor element comprising an active layer disposed within the trench and comprising a second material different from the first material, wherein the first image sensor element is configured to generate a first electrical signal from electromagnetic radiation within a first range of wavelengths;

a second image sensor element comprising a charge storage region disposed within the substrate, wherein the charge storage region is spaced vertically between the active layer and the second surface of the substrate, wherein the second image sensor element is configured to generate a second electrical signal from the electromagnetic radiation within a second range of wavelengths different from the first range of wavelengths;

an isolation region disposed within the substrate between the charge storage region and the active layer, wherein the charge storage region and the isolation region comprise the first material; and an isolation structure extending into the substrate from the second surface to a point vertically above the isolation region, the isolation structure having sidewalls abutting the isolation region on opposing sides of the active layer in a cross-sectional view.

9. The integrated chip of claim 8, further comprising:

a buffer layer spaced between the opposing sidewalls of the substrate and the active layer, wherein the buffer layer extends along a bottom surface of the active layer; and a doped semiconductor layer in the trench and between the buffer layer and the substrate, wherein a bottom surface of the doped semiconductor layer contacts a top of the isolation region, wherein the doped semiconductor layer and the isolation region comprise a first doping type, and the charge storage region comprises a second doping type different from the first doping type.

10. The integrated chip of claim 8, wherein the active layer and the isolation region comprises a first doping type, wherein the charge storage region comprises a second doping type opposite the first doping type.

11. The integrated chip of claim 8, further comprising:

an interconnect structure disposed on the first surface of the substrate, wherein the interconnect structure comprises a conductive via disposed on the active layer.

12. The integrated chip of claim 8, further comprising:

a first floating diffusion node disposed within the substrate and laterally adjacent to the active layer; and a second floating diffusion node disposed within the active layer.

13. The integrated chip of claim 8, wherein the isolation structure continuously laterally wraps around the active layer and the charge storage region in a top view.

14. The integrated chip of claim 13, wherein the charge storage region is spaced vertically between a top surface of the isolation structure and a bottom surface of the isolation structure.

15. An integrated chip, comprising:

a substrate having a first surface over a second surface, wherein the substrate has a pair of interior sidewalls facing one another and defining a trench region extending into the first surface of the substrate, and wherein the substrate comprises a first material;

an active layer disposed within the trench region and having a bottom surface vertically below the first surface of the substrate, wherein the active layer comprises a second material different from the first material;

a buffer layer arranged in the trench region between the active layer and the substrate, wherein the buffer layer comprises the first material and the second material, wherein the buffer layer wraps around a first sidewall of the active layer, a second sidewall of the active layer, and the bottom surface of the active layer, wherein the first sidewall and the second sidewall are on opposing sides of the active layer, wherein a concentration of the first material in the buffer layer continuously decreases from a bottom surface of the buffer layer in a direction towards the bottom surface of the active layer; and a charge storage region in the substrate and vertically offset from the buffer layer in a direction towards the second surface of the substrate.

16. The integrated chip of claim 15, wherein a vertical distance between the buffer layer and a top of the charge storage region is greater than a thickness of the buffer layer.

17. The integrated chip of claim 15, wherein a top surface of the active layer and a top surface of the buffer layer are aligned with the first surface of the substrate.

18. The integrated chip of claim 15, further comprising:

a floating diffusion node in the substrate and adjacent to the active layer; and a gate structure in the substrate and extending from the first surface of the substrate to a top of the charge storage region, wherein the floating diffusion node is spaced laterally between the gate structure and the active layer, wherein the gate structure is configured to transfer charge accumulated in the charge storage region to the floating diffusion node.

19. The integrated chip of claim 18, further comprising:

an isolation region in the substrate and vertically between the charge storage region and the buffer layer, wherein the gate structure laterally separates a first portion of the isolation region and a second portion of the isolation region by a non-zero distance, and wherein a distance between a bottom of the isolation region and the second surface of the substrate is greater than a thickness of the active layer.

20. The integrated chip of claim 18, wherein the floating diffusion node and the charge storage region comprise a first doping type, wherein a top of the floating diffusion node is aligned with the first surface of the substrate, wherein a distance between a bottom of the floating diffusion node and the top of the charge storage region is greater than a thickness of the active layer.

* * * * *